(12) United States Patent
Meijer et al.

(10) Patent No.: US 7,791,141 B2
(45) Date of Patent: Sep. 7, 2010

(54) FIELD-ENHANCED PROGRAMMABLE RESISTANCE MEMORY CELL

(75) Inventors: Gerhard Ingmar Meijer, Zurich (CH); Chung Hon Lam, Peekskill, NY (US); Hon-Sum Phillip Wong, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/176,173

(22) Filed: Jul. 7, 2005

(65) Prior Publication Data
US 2006/0027893 A1  Feb. 9, 2006

(30) Foreign Application Priority Data
Jul. 9, 2004  (EP) .................. 04405439

(51) Int. Cl.
*H01L 29/76* (2006.01)
(52) U.S. Cl. .................. 257/351; 257/379; 257/536; 257/537; 257/E27.004; 257/E27.071
(58) Field of Classification Search ................ 257/351, 257/379, 536, 537; 438/382; 365/174, 182
See application file for complete search history.

(56) References Cited

U.S. PATENT DOCUMENTS

| 3,796,926 | A | * | 3/1974 | Cole et al. ..................... 257/4 |
| 5,618,749 | A | * | 4/1997 | Takahashi et al. ........... 438/384 |
| 2003/0148545 | A1 | * | 8/2003 | Zhuang et al. .................. 438/3 |
| 2004/0090815 | A1 | * | 5/2004 | Tajiri .......................... 365/148 |
| 2005/0167699 | A1 | * | 8/2005 | Sugita et al. ................. 257/202 |
| 2006/0006471 | A1 | * | 1/2006 | Rossel et al. ................ 257/358 |
| 2006/0289908 | A1 | * | 12/2006 | Bednorz et al. ............. 257/288 |

FOREIGN PATENT DOCUMENTS

JP  2003-68854  *  3/2003

* cited by examiner

*Primary Examiner*—A. Sefer
(74) *Attorney, Agent, or Firm*—Michael J. Buchenhorner; Vazken Alexanian

(57) ABSTRACT

Provides a field-enhanced programmable resistance memory cell. In an example embodiment, a resistor includes a resistance structure between a first electrode and a second electrode. The resistance structure includes an insulating dielectric material. The second electrode includes a protrusion extending into the resistance structure. The insulating dielectric material includes a material in which a confined conductive region with a programmable resistance is formable via a conditioning signal.

11 Claims, 3 Drawing Sheets

FIELD-ENHANCED PROGRAMMABLE RESISTANCE MEMORY CELL

FIELD OF THE INVENTION

The present invention is directed to a resistor with programmable electrical resistance. The invention is further directed to a microelectronic device or non-volatile memory device comprising the resistor for storing digital information and to a method for fabricating such resistor.

BACKGROUND OF THE INVENTION

For memory devices and for numerous other applications, bistable devices or circuits are used. For example, for storing one bit of information in a memory, a bi-stable device can be used which is switchable between (at least) two different and persistent states. When writing a logical "1" into the device, it is driven into one of the two persistent states and when writing a logical "0", or erasing the logical "1", the device is driven into the other of the two different states. Each of the states persists until a next step of writing information into the device or erasing information in the device proceeds.

Flash erasable programmable read only memory (FEPROM or flash memory) is used in semiconductor devices and provides for rapid block erase operations. Flash memory generally requires only the use of one transistor per memory cell versus the two transistors per memory cell required for conventional electrically erasable programmable read only memory (EEPROM). Thus, flash memory takes up less space on a semiconductor device and is less expensive to produce. However, the need to develop further space saving components and to remain cost efficient in the fabrication of semiconductor devices continues.

To that end, the use of materials with bi-stable electrical resistance for semiconductor device applications has been studied. The resistance states of the material can be changed reversibly by applying short electrical pulses to the material. These pulses should be larger than a given threshold $V_T$ and longer than a given time t. The resistance state of the material can be read or analysed by applying other pulses which are non-destructive to the conductivity state if they are much smaller than $V_T$.

U.S. Pat. No. 6,204,139 describes a method for switching properties of perovskite materials used in thin film resistors. The properties, in particular the resistance, are switched reversibly by short electrical pulses. Application of the method for memory cells and for sensors with changeable sensitivity is proposed.

The articles "Reproducible switching effect in thin oxide films for memory applications" by A. Beck et al., Applied Physics letters, Vol. 77, No. 1, July 2000, "Current-driven insulator-conductor transition and non-volatile memory in chromium-doped $SrTiO_3$ single crystals" by Y. Watanabe et al., Applied Physics Letters, Vol. 78, No. 23, June 2001, and "Electrical current distribution across a metal-insulator-metal structure during bistable switching" by C. Rossel et al., Journal of Applied Physics, Vol. 90, No. 6, September 2001 and the international application publication WO 00/49659 A1 describe materials and classes of materials with programmable resistance, and simple resistor devices made from these materials.

Transition metal oxides are one class of materials that can be conditioned such that they exhibit the desired bi-stable electrical resistance. This conditioning process comprises subjecting the insulating dielectric material to an appropriate electrical signal for a sufficient period of time. This conditioning process generates a confined conductive region in the transition metal oxide that can be reversibly switched between two or more resistance states.

The confined conductive region is generated at an arbitrary position in the dielectric material, i.e., the position of the conducting path is not controlled by well defined process parameters. This leads to a large variation in the electrical properties of nominally identical memory cells comprising conventional programmable resistors and of devices comprising such memory cells.

The time-consuming conditioning process and the large variations of the properties of nominally identical programmable resistors used in the memory cells and of devices comprising such memory cells are severe drawbacks for manufacturability.

SUMMARY OF THE INVENTION

It is therefore an aspect of the present invention to provide an improved resistor, memory cell, and method for making those. This aspect is achieved by providing a resistor, a memory cell, a memory device and by a method for fabricating a resistor described below.

A structure in accordance with the present invention, has a property of an enhanced local electrical field at a predetermined position for generating the confined conductive region in the dielectric material. In this structure, defined process parameters can be used to control the position of the confined conductive region. Therefore the variation in the electrical properties of nominally identical memory cells is reduced significantly. Moreover, the time for the conditioning process is shortened.

In accordance with the present invention there is also provided a resistor comprising a first electrode, a second electrode facing the first electrode and a resistance structure between the first electrode and the second electrode. The second electrode comprises a protrusion that extends into the resistance structure.

BRIEF DESCRIPTION OF THE DRAWINGS

These and other objects and features of the present invention will become clear from the following description taken in conjunction with the accompanying drawings in which.

DESCRIPTION OF THE INVENTION

Figure 1:
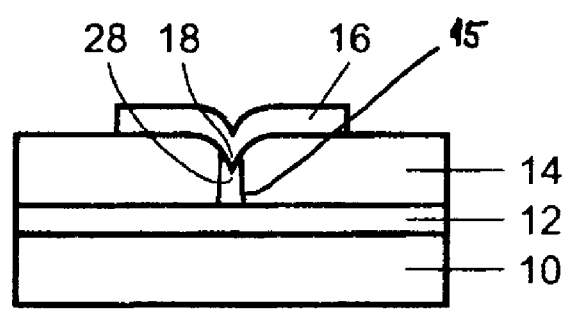
FIG. 1 shows a schematic cross-section of a first preferred embodiment of a resistor.

The present invention provides an improved resistor, memory cell, and method for making those. The structure of the present invention has a property of an enhanced local electrical field at a predetermined position for generating the confined conductive region in the dielectric material. In this structure, defined process parameters can be used to control the position of the confined conductive region. Therefore the variation in the electrical properties of nominally identical memory cells is reduced significantly. Moreover, the time for the conditioning process is shortened.

In accordance with the present invention there is provided a resistor including a first electrode, a second electrode facing the first electrode and a resistance structure between the first electrode and the second electrode. The second electrode comprises a protrusion that extends into the resistance structure.

In an advantageous embodiment the resistance structure comprises an insulating dielectric material in which a confined conductive region is formed between the first and second electrode.

In accordance with the present invention there is also provided a non-volatile memory cell including a resistor as mentioned above, wherein the confined conductive region provides a first or lower resistance state and a second or higher resistance state, wherein the resistance state of the confined conductive region is switchable between the first resistance state and the second resistance state by a control signal, and wherein the resistance state of the confined conductive material indicates the information stored in the memory cell.

In accordance with the present invention there is also provided a method for fabricating a resistor, including producing a first electrode and producing an insulating dielectric structure with an indentation, and providing a second electrode with a protrusion that extends into the indentation.

In an advantageous embodiment the resistor has a confined conductive region being able to have a first or lower resistance state and a second or higher resistance state and the resistance state of the confined conductive region being switchable between the first resistance state and the second resistance state by a control signal.

The protrusion localizes the generation of a confined conductive region and in particular of a conductive filament to a predetermined position, thereby controlling the electronic properties of this conductive filament. Further, conductive filaments are predominantly generated in regions with enhanced electrostatic fields. This cognition is utilized for the approach to generate an enhanced electrical field at a predetermined position in the dielectric material, thereby providing a predetermined position for the confined conductive region.

This provides the advantage that the confined conductive region is localized by an enhanced electrical field that is generated at a position which is controlled by defined process parameters. The localization of the conductive filament results in a better reproducibility of the electronic and electric properties of the device.

A non-volatile memory device including memory cells in an array provides a lower statistical spread of the threshold voltages for storing information in each memory cell and of the signals received from each memory cell when information is read therefrom. These beneficial properties improve the operational reliability and facilitate miniaturization and low-power operation. Moreover because of the enhanced electrical field available, the time required for the conditioning process is reduced. This will reduce the manufacturing costs.

FIG. 1 is a schematic view of a vertical cross-section of a resistor according to a first advantageous embodiment. On a substrate 10, a first electrode 12 is provided. A layer of an insulating dielectric material 14 is deposited over the first electrode 12. The insulating dielectric material 14 is also referred to as resistance structure 14. The insulating dielectric material 14 is here formed such that it comprises an indentation 28 towards the first electrode 12. A second electrode 16 is deposited on the insulating dielectric material 14 in such a way that the insulating dielectric material 14 is at least partially sandwiched between the first electrode 12 and the second electrode 16 and such that the second electrode 16 protrudes with a protrusion 18 into the indentation 28 in the insulating dielectric material 14 towards the first electrode 12. The second electrode 16 generates no additional strain field by temporal or continuous application of mechanical stress in the insulating dielectric material 14. The insulating dielectric material 14 is a material in which a confined conductive region 15, also referred to as conductive filament, with programmable resistance can be formed by applying a conditioning signal in the form of a sufficiently strong electrical field to the insulating dielectric material 14. The programmable resistance is provided by a characteristic of the material that provides for several stable resistance states between which it is switchable. In other words, the material has a multistable, e.g. bi-stable resistance. Alternatively, the insulating dielectric material 14 is a material in which such a confined conductive region 15 can be formed by applying a thermal signal, a pressure signal, a radiation signal, or any other conditioning signal.

Advantageously, the size and shape of the protrusion 18 of the second electrode 16 is selected to generate a maximum local enhancement of the electrical field in the insulating dielectric layer 14 and to position the conductive filament to be formed.

The insulating dielectric material 14 is preferably a doped or undoped transition metal oxide. Good results have been achieved in particular with strontium and/or barium titanium oxide $(Sr,Ba)TiO_3$, strontium zirconium oxide $SrZrO_3$, tantalum oxide $Ta_2O_5$, calcium niobium oxide $Ca_2Nb_2O_7$, praseodymium and/or calcium manganese oxide $(Pr,Ca)MnO_3$ and other transition metal oxides with perovskite or perovskite-like structures, each material doped preferentially with chromium, manganese, or vanadium. Further the materials described in the above-mentioned documents, incorporated herein by reference, are advantageously usable in the herein described memory device. The insulating dielectric material 14 is amorphous. It can be grown by means of multiple techniques such as MOCVD, sputtering, MBE, ALD, sol-gel, PLD etc.

After fabricating the resistor shown in FIG. 1 initially no confined conductive region exists in the insulating dielectric material 14. The confined conductive region is generated in a conditioning process. The conditioning process advantageously comprises applying a conditioning signal, e.g. a predetermined voltage to the insulating dielectric material 14 via the electrodes 12, 16. This predetermined voltage and the duration of its application are set or tuned such that no local melting of the insulating dielectric material 14 and no other kind of destructive breakdown occurs. This condition supplies upper limits for the size of the conditioning signal, in particular for the duration and the voltage of the conditioning signal.

On the other hand, the conditioning process depends on the properties of the insulating dielectric material 14 (stoichiometry, doping, thickness, presence and density of lattice defects etc.), on the material, the surface properties and the shape of the electrodes 12, 16, on the temperature and on other ambient parameters. Therefore, the conditioning process is selected strong enough to make sure that a confined conductive region is formed.

In some cases when, for example, an amorphous insulating dielectric material 14 is used, the conditioning process may locally transform the material to a crystalline structure.

It is an advantage of the described device and method to make the conditioning process more reliable and faster and to render the tuning of the conditioning signal less critical and thus easier. The reason for this will be explained subsequently.

The region where the locally enhanced electrical field is generated by the convex geometrical feature, i.e. the protrusion 18 of the second electrode 16 protruding into the insulating dielectric material 14 is the most probable place where a conductive filament forms. Most probably, the conductive filament, i.e. confined conductive region forms at the place of maximum electrical field. The protrusion 18 causes focalisation of the electric field and reduces the probability of the conductive filament forming in other places in the insulating dielectric material 14. Thus, the position of the conductive filament is predefined to a higher degree, namely to the area adjacent the protrusion 18.

The duration of the conditioning process depends on the magnitude of the electrical field. Due to the locally enhanced electrical field that is generated by the convex geometrical features of second electrode 16 protruding into the insulating dielectric material 14, the duration of the conditioning signal for a secure conditioning process is shortened.

Another advantageous aspect is that the forming of two or more parallel conductive filaments is less likely. One reason is the pre-definition of the position of the confined conductive region and is described above. The other reason is that the conditioning signal can be made shorter or smaller than conventionally, as also described above.

Both, the defined number of conductive filaments and the defined position of the conductive filament results in better defined electrical and electronic properties of the resistor with a smaller variation of the properties from resistor to resistor.

First tests—with the above described materials—showed that the confined conductive region is stable and exhibits a programmable resistance. To program the resistance state of the conductive filament, electrical control pulses are used as described in the above-mentioned documents, incorporated herein by reference.

Figure 2:
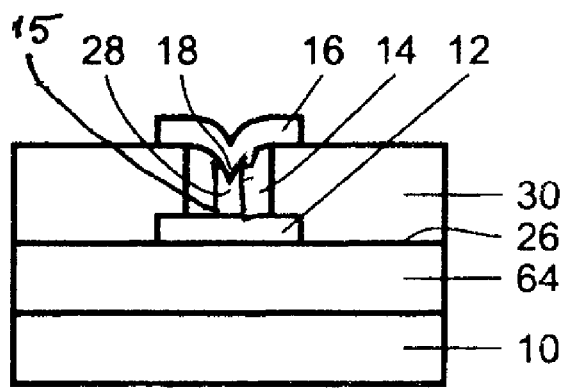
FIG. 2 shows a schematic cross-section of a second preferred embodiment of a resistor.

FIG. 2 is a schematic view of a vertical cross-section of a resistor according to a second advantageous embodiment. The substrate 10 comprises at or below its front surface 26 a CMOS-layer 64. CMOS-circuits may be formed in the CMOS-layer 64, but are not displayed in FIG. 6. On the front surface 26 of the substrate 10, the first electrode 12 is positioned which might also provide a contact to a via plug at the uppermost layer of a CMOS layered arrangement. The insulating dielectric material 14 is embedded in the insulating layer 30 wherein the thickness of the insulation layer 30 is about equal to the thickness of a layer-like part of the insulating dielectric material 14. The insulating dielectric material 14 is deposited such that it comprises a concave pyramidal, conical, prismatic or the like shape with the point or edge protruding towards the substrate 10. The second electrode 16 is deposited over the insulating dielectric material 14 whereby the insulating dielectric material 14 is sandwiched at least partially between the first electrode 12 and the second electrode 16.

Similar to the first embodiment described with reference to FIG. 1, the shape of the insulating dielectric material 14 deviates from a flat layer with parallel surfaces, thereby generating an enhanced electrical field localized at or in the vicinity of the point 28. Again, the effect of the enhanced electrical field in the insulating dielectric material 14 at or in the vicinity of the point 28 is a localization of the position where a confined conductive region 15 is formed in the insulating dielectric material 14 during a conditioning process.

More generally speaking, any convex feature of the second electrode 16 or the first electrode 12 may serve as a protrusion of the dielectric layer 14 and thereby support the generation of an enhanced electrical field. The stronger the deviation of the shape of the electrodes from a flat layer with parallel surfaces, the stronger the electrical field and the stronger the localization of the conductive filament. This means that the radius of curvature of the convex feature can be selected smaller to increase this effect.

Figure 3:
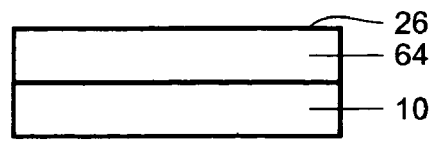
FIGS. 3 to 8 are schematic cross-sections of the second preferred embodiment in different states during fabrication.
Figure 4:
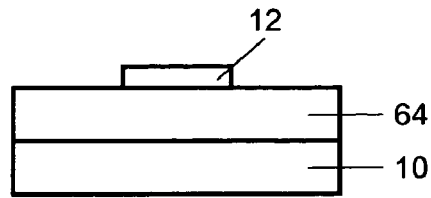
Figure 5:
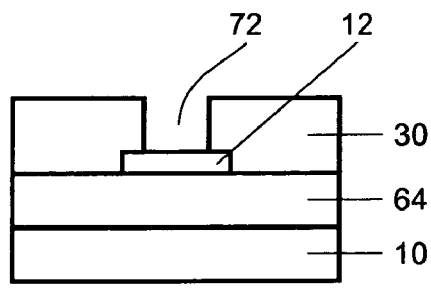
Figure 6:
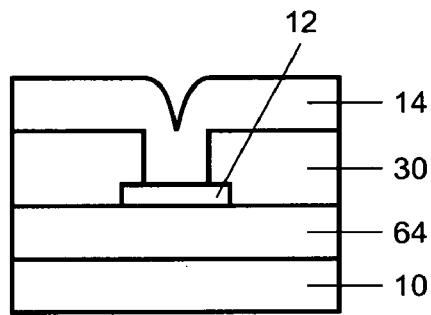
Figure 7:
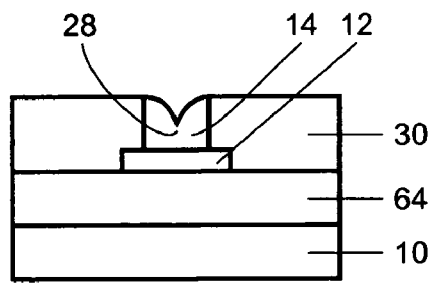
Figure 8:
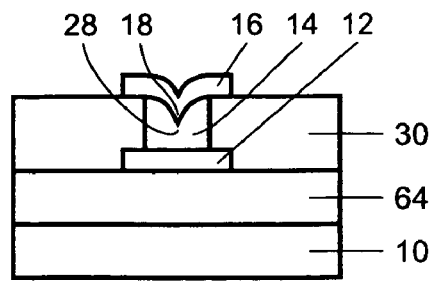

FIGS. 3 to 8 are schematic views of vertical cross-sections of the substrate 10 in different stages of production of the resistor according to the second embodiment described above with reference to FIG. 2. In a preparation step, the CMOS-layer 64 is formed at the front surface 26 of the substrate 10 (FIG. 3). In a first step a conducting layer is provided on the CMOS-layer 64 to form the first electrode 12 (FIG. 4). In a fifth step an insulation layer 30 is deposited and laterally structured to form a cavity 72 at least partly covering the first electrode 12 (FIG. 5). In a second step the insulating dielectric material 14 is deposited over the insulating layer 30 and the first electrode 12. During this deposition the cavity 72 is progressively filled with the insulating dielectric material 14. In this manner, the insulating dielectric material 14 is formed in the cavity 72 with the concave shape of a pyramid or a cone (FIG. 6). The cavity 72 serves hence as a patterning structure, leading to the forming of the indentation 28. This is hence a way to combine the second step and a third step, also referred to as patterning step, at the same time. Alternatively, those two steps can be conducted in series. The thickness of the dielectric layer 16 is reduced by an etching process while retaining the concave shape of the indentation 28 (FIG. 7). The processes described above with reference to FIGS. 6 and 7 may be combined in a so called dep-etch process wherein the time interval between the deposition of a layer and back-etching of the same layer is varied. In a fourth step the second electrode 16 is deposited over the insulating dielectric material 14 and laterally structured (FIG. 8) to result in the structure of the second embodiment described above with reference to FIG. 2. The protrusion 18 is automatically created by means of the indentation 28.

In the described embodiments, the resistor comprises the insulating dielectric material in which the confined conductive region is formed or is to be formed. The insulating dielectric material together with the confined conductive region is called a resistance material with programmable resistance although the resistance and the programmable resistance material property of the material are in fact localized at confined conductive region.

As an alternative, the first electrode 12 provides a convex feature protruding towards the second electrode 16. The insulating dielectric layer 16 is deposited over the first electrode with a subsequent planarization step, by chemical-mechanical polishing for example. In this case the convex feature of the first electrode 12 induces an enhanced electrical field in the insulating dielectric material 14. This means that the first electrode 12 and the second electrode 16 are interchangeable.

Figure 9:
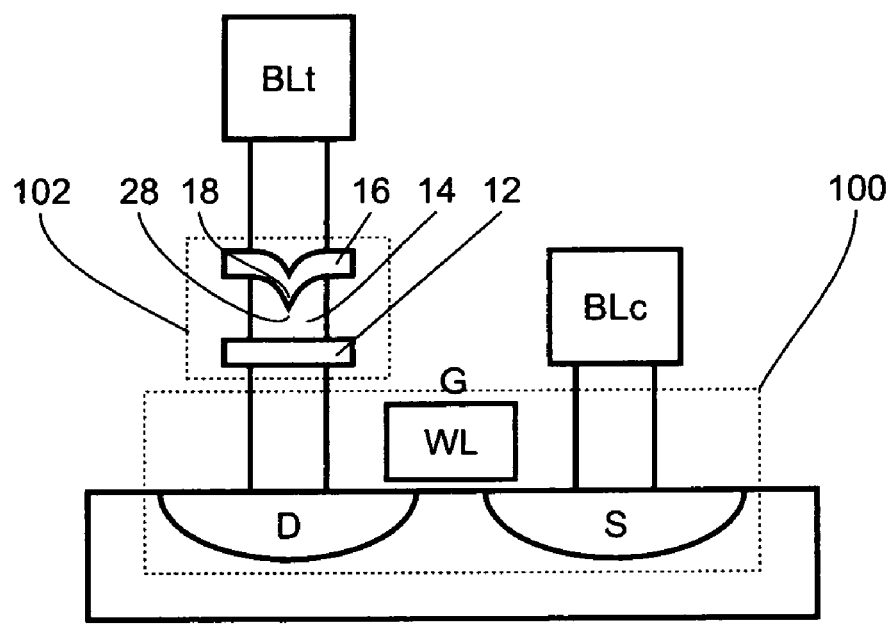
FIG. 9 shows a schematic cross-section of an exemplary semiconductor layout of the memory cell.

FIG. 9 is a schematic cross-section illustrating an exemplary semiconductor layout of the memory cell according to another advantageous embodiment. The programmable resistor 102 is here built into a memory cell in the form of a so-called IT-LR structure, using a transistor 100. The first electrode 12 is connected to the drain contact D of that transistor 100. The gate contact G functions as the word line contact WL, and the source contact S is used as bit line contact BLc. The second electrode 16 is here connected to a bit line terminal BLt. This structure can be incorporated in an array, usable as a memory device. For this array a controller is provided (not depicted in the figure) for applying an electrical writing signal to a selected one of the memory cells in order to write information into the memory cell. Further, the controller is provided for applying an electrical reading signal to a selected one of the memory cells in order to read information from the memory cell. The information is read by sensing or analyzing the resistance of the memory cell.

Advantageously the writing signal and the reading signal are each voltage or current pulses. The amplitude and the duration of the writing signal are selected or set such that the resistance state of the resistor of the memory cell is altered by the signal. This condition is fulfilled if the amplitude exceeds a predetermined voltage or current threshold, for example. Advantageously the reading signal is smaller than this threshold. Thus it does not alter the resistance state of the memory cell.

The resistance state of each resistor corresponds to the information stored in the memory cell. For example, a first, lower-resistance state corresponds to a logical "0" and a second, higher-resistance state corresponds to a logical "1". As described above, the logic state of each memory cell or resistor, respectively, is altered by a writing signal or control signal and read by sensing or measuring its resistance state. If each of the resistors provides more than two persistent resistance states more than one bit of information can be stored in one resistor.

The term "conductive filament" also embraces implementations including a confined but more extended conductive region within the insulating dielectric material. In other words, although the bi-stable switching resistance property seems to be confined to thin conductive filaments in at least some of the "programmable resistance materials" known and analysed at present, the present invention is not limited to these thin conductive filament cases. Rather, the present application is applicable advantageously to all materials that exhibit bi-stable resistance localised to a confined region even if this region is more extended than a thin conductive filament.

It is noted that the term "bi-stable" does not exclude applications with more than two stable resistance states. Rather, the present invention is also applicable advantageously to materials with more than two persistent resistance states.

Further, it is noted that the persistent resistance states described in the above embodiments may be perfectly stable for an infinite period of time or may decay or vanish continuously or discontinuously within a certain period of time.

Further, it is noted that in the context of this application an insulating dielectric material is any material with a specific resistance that is higher than the specific conductivity within the confined electrically conductive region in its low-resistance state.

In the embodiments described above, the conductive filaments are formed by applying sufficiently large voltage or current pulses to the material. However, it is clear from the above description that the conditioning is not necessarily started or caused by an electric signal. Alternatively, an insulating dielectric material is used in which a conditioning process is caused or at least started or facilitated by applying a radiation signal, a heat signal, a pressure signal or any other conditioning signal or a combination of two or more physical actions.

Further, the present invention is not limited to applications with a bi-stable switching resistance property. Rather, the present invention is advantageous for all applications in which a confined electrically conductive region within an insulating dielectric material is formed or is to be formed at a predetermined position. The position of the confined conductive region is self aligned to the position of the enhanced electrical field.

In all embodiments described above the first electrode, the insulating dielectric material and the second electrode are each extended in directions parallel to the surface of the substrate and are arranged in the form of a stack perpendicular to the surface of the substrate. Consequently, the confined conductive region is oriented essentially perpendicular to the substrate and the surface of the substrate. Alternatively, the first electrode, the insulating dielectric material and the second electrode are arranged laterally side by side at the surface of a substrate, and the confined conductive region is oriented parallel to the surface of the substrate.

In the preceding embodiments, the confined conductive region is sandwiched between two electrodes. Electrical pulses are applied to the resistance material via these electrodes. Although an electrode is typically a metallic solid state member, every electrically conductive member is an electrode. However, alternatively only one electrode abuts to the resistance material. The other side of the resistance material may be in direct contact to an electrolyte, plasma or any other electrically conductive fluid.

Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed, is:

1. A resistor comprising a resistance structure comprising:
   a first electrode;
   a second electrode,
   an insulating dielectric transition-metal oxide material deposited over the first electrode such that said insulating dielectric material comprises a concave shape with an edge protruding towards a substrate;
   wherein said second electrode comprises a protrusion extending into the resistance structure, and
   wherein said insulating dielectric material comprises an amorphous layer;
   wherein said second electrode is deposited on the insulating dielectric material in such a way that the insulating dielectric material is at least partially sandwiched between the first electrode and the second electrode and such that the second electrode protrudes with a protrusion into the indentation in the insulating dielectric material towards the first electrode; and
   a confined conductive region with programmable resistance comprising a conductive filament, formed upon application of a conditioning signal at a predetermined voltage to the protrusion in the insulating dielectric material.

2. A resistor according to claim 1, wherein the confined conductive region provides a first or lower resistance state and a second or higher resistance state, wherein the resistance state of the confined conductive region is switchable between the first resistance state and the second resistance state by a control signal, and wherein the resistance state of the confined conductive material indicates the information stored in the memory cell.

3. A resistor according to claim 1, wherein said conditioning signal is one of: an electrical, a thermal, a radiation, and a pressure signal.

4. A resistor according to claim 1, wherein said insulating dielectric material comprises at least one confined conductive region.

5. A resistor according to claim 4, wherein at least one confined conductive region is located in an area adjacent the protrusion.

6. A resistor according to claim 4, wherein at least one confined conductive region exhibits several stable states of different resistance between which it is switchable.

7. A resistor according to claim 6, wherein at least one confined conductive region is switchable between the resistance states by an electric pulse.

8. A resistor according to claim 1, wherein said first electrode is arranged at a substrate, said substrate preferably having a CMOS layer.

9. A resistor according to claim 1, wherein said insulating dielectric material is embedded in an insulating layer.

10. A resistor according to claim 9, wherein said insulating dielectric material comprises one of a concave, pyramidal, conical, and prismatic shape.

11. A resistor according to claim 1, wherein said insulating dielectric material comprises a perovskite material.

* * * * *